United States Patent [19]

Graham

[11] 4,362,783

[45] Dec. 7, 1982

[54] POLYMER COATINGS AND METHODS OF APPLYING SAME

[75] Inventor: Lionell Graham, Falls Township, Lower Bucks County, Pa.

[73] Assignee: Western Electric Company, Incorporated, New York, N.Y.

[21] Appl. No.: 181,512

[22] Filed: Aug. 26, 1980

[51] Int. Cl.³ .................... B32B 15/18; B32B 15/08
[52] U.S. Cl. .................................... 428/338; 428/336; 428/411; 428/413; 428/432; 428/447; 428/448; 428/450; 428/457; 428/429; 428/469; 428/470; 428/471; 428/472; 428/492; 428/901
[58] Field of Search ............... 428/450, 447, 471, 472, 428/470, 448, 413, 901, 336, 338, 432, 457, 429, 411, 469, 688, 492

[56] References Cited

U.S. PATENT DOCUMENTS

| | | | |
|---|---|---|---|
| 2,336,388 | 12/1943 | Beebe | 428/469 |
| 3,657,003 | 4/1972 | Kenney | 428/469 |
| 4,037,019 | 7/1977 | Steger | 428/469 |
| 4,052,524 | 10/1977 | Harakas | 428/450 |
| 4,087,586 | 5/1978 | Feldstein | 428/457 |
| 4,118,540 | 10/1978 | Amort | 428/450 |
| 4,126,469 | 11/1978 | Longuepee | 148/6.15 Z |
| 4,218,513 | 8/1980 | Williams | 428/450 |

OTHER PUBLICATIONS

Plueddeman, Edwin P., "Adhesion Through Silane Coupling Agents", *J. of Adhesion*, 2, 184 et seq. (1970).

*Primary Examiner*—Ellis P. Robinson
*Attorney, Agent, or Firm*—Joel F. Spivak

[57] ABSTRACT

Polymeric coatings can be applied to substrates such as metal foils by first coating the foil with a wetting hydrosol followed by applying a coupling agent thereto and thereafter coating the substrate with the desired polymer.

16 Claims, 1 Drawing Figure

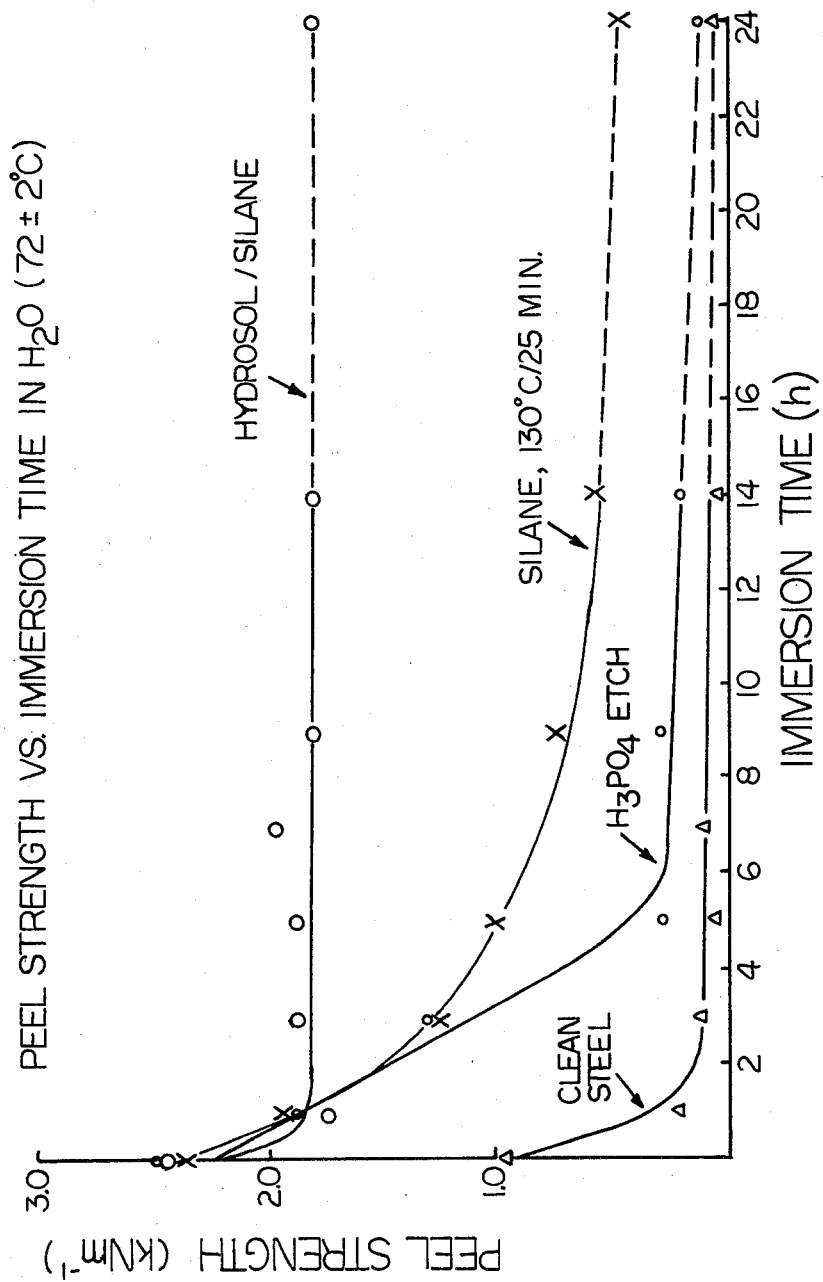

4,362,783

POLYMER COATINGS AND METHODS OF APPLYING SAME

TECHNICAL FIELD

This invention relates to polymer coatings and methods of applying these coatings on various substrate surfaces. In particular, it relates to polymer coatings on metal surfaces employing coupling agents for use as corrosion resistant layers, printed circuit boards and the like.

BACKGROUND OF THE INVENTION

Polymers coated on various substrates have many different uses ranging from protective coatings, corrosion resistant coatings, laminates, sealants and encapsulants to dielectric films for capacitors and the production of printed wiring boards.

Generally, in most uses, the adhesion of the polymer coating to the substrate upon which it is applied is of great importance. Very often, a particular polymer will not reproducibly adhere well when applied directly to a given type of substrate and therefore, is not suitable as a coating material for that substrate. It has previously been discovered, however, that the adhesion of many polymer-substrate pairs can be enhanced by the use by what has been termed a coupling agent. The coupling agent may be applied to the substrate surface or may be dispersed in the polymer. These coupling agents contain moieties which bond to the substrate as well as moieties which bond to the polymer. In some instances the same moiety may be responsible for bonding to both the substrate and the polymer. Various types of material have been reported as being suitable as coupling agents including, but not limited to silanes, Werner-type complexes, various metal organic compounds such as alkoxy titanates and other materials. For example, reference may be made to an article entitled "Adhesion Through Silane Coupling Agents" by Edwin P. Pluedemann, Journal of Adhesion, 2, 184 et seq. (1970). This reference indicates the use of silane coupling agents to couple various types of polymers including epoxies, polyesters, polystyrenes, phenolics, polypropylenes and polyamides, among others, to substrates such as glass, aluminum, steel, graphite and the like. The teachings of this article are incorporated herein by reference.

Although coupling agents have led to increased adhesion of both thermoplastic and thermosetting polymers to the various substrates as set forth above, there is still a need for greater improvement for many purposes. For example, while a silane coupling agent for an epoxy coating on steel may result in an adequate adhesion for corrosion resistant coatings under normal conditions, the adhesion may not be adequate under abnormal or severe conditions. Similarly, epoxy coatings over steel employing a silane coupling agent for printed circuit boards may not have adequate adhesion when immersed in various electroless plating baths especially at elevated temperatures or when the epoxy coating is applied at high temperatures such as by means of a fluidized bed coating process. There is also a need for improved bonding of metal sheathing in metal sheathed cable to the polymeric cable jacket material, usually polyethylene. Consequently, there is still a need for further improvements in coating adhesions for many applications and generally improved coating adhesion is desirable.

SUMMARY OF THE INVENTION

I have discovered that coating adhesions of many polymers to various substrates can be improved by the inclusion of a very thin layer of a wetting hydrosol which is adherent to the substrate to which the coating is to be applied and to a coupling agent capable of bonding to both the wetting hydrosol and the polymer which is to be coated upon or adhered to the substrate. The inclusion of this wetting hydrosol generally leads to coatings or unions of materials having a higher adhesion than either a coating with the hydrosol alone and no coupling agent, a coating with the coupling agent without the hydrosol or a coating having neither coupling agent nor hydrosol.

Consequently, the invention may be summarized in broad terms by a method of uniting materials comprising applying a layer of an adherent wetting hydrosol to the surface of a base material, applying a coupling agent having a moiety capable of adhering to the hydrosol and a moiety capable of adhering to a moiety of a polymer to be united therewith and thence adhering the polymer to the base material. The article of manufacture resulting therefrom therefore comprises a substrate, a layer of an adherent wetting hydrosol over at least a portion of the substrate, a polymeric layer thereover and a coupling agent between the wetting hydrosol and the polymeric layer which bonds to both the hydrosol and the polymeric layer. Also included is the substrate coated with hydrosol and coupling agent in preparation for later coating with a polymer.

BRIEF DESCRIPTION OF THE DRAWINGS

FIG. 1 is a graph depicting peel strength vs. immersion time in $H_2O$ (72° ±2° C.).

DETAILED DESCRIPTION

While the invention may be employed for the manufacture of metal sheathed, jacketed cable and other uses, it will be described herein in terms of coating of a substrate. As previously pointed out, it has long been known in the prior art to employ a coupling agent to a surface prior to coating the surface with a desired coating composition to enhance the adhesion of the coating composition with the surface. However, certain substrates, especially hydrophylic substrates, remain difficult to coat with good adhesion. I have discovered that by modifying the prior art teachings, more specifically, by including a very thin layer of a wetting hydrosol on the substrate which is adherent to both the substrate and the coupling agent, adhesion to the polymer coating to be applied over the substrate can be enhanced in most instances.

The novel method is suitable for preparing coated articles on various types of substrate materials including but not limited to metals, ceramics, glass, minerals, plastics and composites. The substrate material may be in any form including, for example, sheets, films, and synthetic or natural fibers. As previously indicated, these coatings can be used for example, as corrosion-resistant and protective coatings for metallic surface encapsulants and hermetic sealants for electronic devices, the manufacture of sheathed cable and for the production of printed wiring boards as well as the other uses.

For purposes of the instant disclosure, a wetting hydrosol is defined as a hydrosol which renders a nonwettable or hard to wet surface wettable. Such wetting hydrosols are general aqueous dispersants containing a hydrous oxide solid phase in the form of a stable colloid or as subcolloidal particles. Wetting hydrosols have been discussed in great detail in U.S. Pat. No. 3,657,003, issued to John Thomas Kenney. Kenney teaches the preparation and use of many such wetting hydrosols and the teachings of Kenney are included by reference as if more specifically set forth herein. Also, for the purposes used herein metal substrates include metal alloys and metals and alloys having oxidized surfaces.

The term coupling agent as used herein shall mean any agent, compound or composition which includes moieties capable of bonding to the wetting hydrosol as well as moieties capable of bonding to the polymer coating to be applied. Examples of suitable coupling agents are silanes, amino silanes, Werner complexes, metal-organic compounds and various polymers having acidic or basic functional groups. Examples of coupling agents include γ-(β-aminoethyl)aminopropyltrimethoxy silane, γaminopropyltriethoxy silane, γ-glycidyloxypropyl trimethoxy silane, glycidyloxytriethoxy silane, titanium di(dioctylpyrophosphate) oxyacetate, tetralkoxy titanates, polar surfactants and Werner complexes, e.g., methylacrylate chromium chloride. However, it should be understood to one skilled in the art that this invention is not limited to any particular wetting hydrosol or any particular coupling agent so long as the wetting hydrosol employed has the ability to bond to the substrate and to the coupling agent and that the coupling agent, in turn, can also bond to the polymer coating so as to result in a polymer coating having an enhanced or more reliable or more reproducible adhesion strength to the substrate. Similarly, the invention is not limited to any particular polymer or class of polymers but the polymer used must simply be compatible, as aforesaid, with the coupling agent so as to result in the adherent bond desired. In addition, it may be noted that the wetting hydrosol, while generally in the form of hydrous oxides, can also be in other forms, such as oxalates, acetates or other compositions which function in the same manner.

For exemplitive purposes, the examples as hereinafter set forth shall deal with the epoxy coating of metals, primarily steel, to form a corrosion resistant layer thereon for the purpose of subsequent treating by means of sensitization with electroless plating solutions to form printed circuit boards. As previously stated, it should be understood that these examples are merely exemplary and that this invention is not limited to the particular substrates, wetting hydrosols, coupling agents, or polymers as set forth in the specific examples nor the particular purpose recited above.

It has been discovered that as a general rule, the best polymer to substrate adhesion occurs when the intermediate layers of wetting hydrosol and coupling agent exhibit what appears to be chemical bonding between wetting hydrosol and substrate, wetting hydrosol and coupling agent and coupling agent and polymer. It has been hypothesized that such strong bonding can be achieved where there is a Lewis acid-Lewis base type interaction between adjacent materials. For example, the surface of an aluminum substrate would form a strong couple to an alkali or alkaline earth metal wetting hydrous oxide hydrosol. In this instance the aluminum surface is considered to be a Lewis acid with respect to the hydrosol which acts as a Lewis base. The coupling agent thence employed should have acidic moieties such as carboxyl or carboxylic acid groups to enhance bonding to the basic hydrosol. Conversely, if the substrate was magnesium (a basic surface) a preferred hydrosol would be an acidic hydrosol such as a hydrosol of aluminum and the coupling agent should have basic moieties such as amine groups. In the case of glass substrates or substrates of metals such as iron, a preferred hydrosol is a wetting hydrosol of tin. Here a weak acid-weak base interaction appears to occur, a preferred coupling agent employed over the tin hydrosol is an amine containing silane.

Another unexpected discovery is that not only should the hydrosol be dissimilar from the substrate surface so as to form acid-base type interaction, but the wetting hydrosol should only be a monolayer in thickness for maximum adhesion to be achieved. This is believed to be true since thickness greater than a monolayer results in hydrosol-hydrosol coupling, i.e., coupling of similar materials not having an acid-base interaction, together with the desired acid-base interaction between the first hydrosol layer and the substrate surface, thereby yielding many weak bonds along with the stronger hydrosol-substrate bonds.

The following is a general procedure in accordance with the invention. First, the substrate should be pre-cleaned and rinsed to remove dirt, grease and the like; the substrate is then treated with the wetting hydrosol composition, preferably by immersion therein; after removal from the hydrosol bath, it is preferred to rinse the substrate so as to remove any contaminating or corrosive species and to remove loosely bonded hydrosol so as to leave essentially a monolayer of strongly bonded hydrosol. Thereafter the substrate is treated with the coupling agent, air dried or preferably baked dry and finally coated with the desired polymer which is then cured. The thus coated substrate is then ready for use or further processing depending upon the desired use. For example, the coated substrate may be used as a base material for the manufacture of printed circuit boards. If this is the case, the substrate is processed by any of the standard techniques of manufacturing printed circuit boards. Such techniques include laminating a copper foil layer and processing the laminate by any of the well known photoresist-etch subtractive techniques for developing a circuit pattern thereon or by standard additive techniques such as by sensitizing and catalyzing the surface in accordance with a desired circuit pattern followed by immersion in an electroless plating bath to build up the pattern. These processes are well known in the art and need not be recited in detail herein. For example the Kenney reference previously mentioned herein and the references cited by Kenney can be used for this purpose.

For the purposes of demonstrating the invention, one mil thick steel substrates which have been cleaned in an alkaline cleaning solution at a temperature of from about 60°–70° C. to remove surface soil, oil and grease and then rinsed in deionized water have been processed in accordance with the invention using epoxy polymers. For comparison, the same substrates have been polymer coated immediately after the cleaning step; using the wetting hydrosol without coupling agent; and using coupling agent without wetting hydrosol. These samples were tested for adhesion by a standard 90° peel test measured in pounds of force to peel the coating from the substrate per inch of substrate width. The peel test was carried out after polymer cure, and because of interest in the use of this laminate as a printed circuit board, its adhesion was also tested after immersion in a copper electroless plating bath held at 72°±2° C. for 24 hours both before and after a "recovery" bake of the coated substrate at 130° C. or 250° C. The results which were attained with various epoxy formulations appear in the tables below. It was discovered that epoxy formulations employing an attagel/Duomeen T mixture therein gave the best adhesion with use of the novel process. As used hereinafter:

KR138S is Kendrick Co.'s Titanium di(dioctylpyrophosphate)oxyacetate;
KR12 is Kendrick Co.'s isopropyl tri(dioctylphosphato) titanate;
TTS is isopropyl, triisostearoyl titanate;
APS is γ-aminopropyltriethoxy silane;
AEPS is γ-(β-aminoethyl)-aminopropyltrimethoxy silane.

EXAMPLE 1

This example is a control type experiment to obtain peel strengths of epoxy coated steel substrates coated as cleaned, and with treatment with coupling agent only (i.e., no hydrosol treatment). The epoxy was applied by a standard electrostatic coating technique.

A. Here, the steel foil was epoxy coated and cured immediately after cleaning.

B. Here, the cleaned foil was immersed in a 1% solution of coupling agent for 2 minutes, forced air dried and epoxy coated and cured. Coupling agent solutions were aqueous except where indicated as being in isopropanol.

C. Here, the same procedure as in B is followed but with a 1 minute rinse in D.I. water following immersion in the coupling agent.

D. Here, the same procedure as in B is followed except that the samples were baked dry at 130° C. for 25 minutes rather than forced air dried. Some samples were rinsed in the solvent used for the coupling agent subsequent to baking, these are designated as method $D_1$.

The results of peel strength are tabulated below:

TABLE I

| | PEEL STRENGTH POUND/INCH | | | | | | |
|---|---|---|---|---|---|---|---|
| | No Coupling Agent | 138S | TTS | 12S | APS | APS/ isoprop. | AEPS | AEPS isoprop. |
| Method A | 0.6 | | | | | | | |
| Method B | | 2.4 | 3.2 | 6.4 | | | | |
| Method C | | 2.3 | 2.6 | 3.6 | | | | |
| Method D | | 1.2 | 1.2 | 3.4 | 4.0 | 2.6 | 6.3 | 7.9 |
| Method $D_1$ | | | | | 5.2 | 4.0 | 4.6 | 8.6 |

EXAMPLE 2

Various steel substrates were alkaline cleaned and rinsed and then treated in accordance with the following treatment sequence except where otherwise indicated.

(1) Immerse in an iron wetting hydrosol composition comprising a $3.7 \times 10^{-3}$ molar solution of $FeCl_3 \cdot 6H_2O$ at pH2 at ambient temperature for 3 minutes.

(2) Rinse in deionized water while still wet.

(3) Immerse in an aqueous 1% AEPS coupling agent solution at ambient temperature for 2 minutes.

(4) Bake at (a) 130° C. for 25 min. or (b) 240°–260° C. for 15 min.
(this temperature was employed due to the fact that fluid bed epoxy coating, which is one alternate coating technique, require such temperature).

(5) Electrostatically coat/cure to produce 5 mil/side coatings (a) peel test (dry).

(6) Immerse in a copper electroless plating bath held at 72°±2° C. for 24 hours (a) peel test (wet).

(7) Bake (recovery bake) at 150° C. for 1 hr. (a) peel test (bake).

Table 2 gives the results of these tests in accordance with the entire procedure (Process 1); and wherein step (1) i.e., use of the hydrosol is omitted (Process 2); and wherein steps (3) and (4) i.e., use of the coupling agent is omitted (Process 3). It should be noted that a control was run wherein an unprocessed alkaline cleaned substrate was coated and tested. The control had a peel strength of less than 1 lb./in. dry and delaminated in the electroless solution. Similar results were found with Process 3.

TABLE 2

| PEEL STRENGTH - POUNDS/INCH | | | | |
|---|---|---|---|---|
| | EPOXY NO. | DRY | WET | RECOVERY BAKE |
| Process 1(4)(a) | 330.6 | 16.8 | 1.2 | 14.0 |
| Process 1(4)(b) | 330.6 | 15.0 | 0.5 | 11.1 |
| | 102.2 | 8.4 | 0.6 | 3.2 |
| | 1283 | 3.6 | 0.4 | 2.4 |
| Process 2 | 330.6 | 10.4 | 0.3 | 9.4 |
| | 102.2 | 5.6 | 0.4 | 2.0 |
| | 1283 | 1.0 | 0.4 | 1.2 |

It should be noted that all epoxies used herein for determining peel strengths are butadiene-nitrile rubber modified amine cured epoxies of diglycidyl ether of bisphenol A cured at 120° C./16 hrs. As can be seen from the above tables, coatings formed using the novel process of this invention have higher adhesion to the substrate as compared with similar coatings prepared without following the steps of applying an iron wetting hydrosol and then coupling agent prior to coating.

The same procedure was followed as set forth in example 2 except that the wetting hydrosol was a tin hydrosol which deposited a mixed valence hydrous tin oxide on the surface. This hydrosol was prepared in accordance with the method set forth in the aforementioned Kenney patent.

The following Tables represent results utilizing the above procedure and variations thereof Table 3 shows the peel strengths in lbs./in. of epoxy coatings applied to steel as cleaned; after cleaning followed by immersion in silane, rinsing and baking at either 130° C. for 25 min. or 250° C. for 15 min.; and after following the novel process using a tin wetting hydrosol and a 1% AEPS silane coupling agent solution with a pre-bake at either 130° C. or 250° C. Peel strengths were measured after curing the epoxy (dry), after 24 hours immersion in an aqueous electroless plating bath at 72°±2° C. (wet) and after a recovery bake at 150° C. for 1 hr. following immersion.

TABLE 3

EFFECT OF TEMPERATURE ON TREATED SURFACE

| Treatment | Sn wt. ($\mu g\ cm^{-2}$) | Peel Strength (Pounds/Inch) | | |
|---|---|---|---|---|
| | | Dry | Wet | Recovery Bake (150° C./1 hr.) |
| Clean | | 5.5 | 0.4 | 1.1 |
| Clean Silane Bake at 130° C./25 min. | 0 | 13.4 | 2.5 | 6.4 |
| Clean Silane Bake at 250° C./15 min. | 0 | 4.1 | 0.2 | 1.2 |
| Clean Hydrosol Silane Bake at 130° C./25 min. | 0.8 | 12.8 | 10.0 | 10.3 |
| Clean Hydrosol Silane Bake at 250° C./15 min. | 0.8 | 14.0 | 10.3 | 10.7 |

It can be seen from this table that except as indicated below, processing in accordance with the invention gives superior peel strengths dry, wet and after recovery bake as compared to the other processing formats. It may be noted that the dry peel strength after the silane-only treatment and lower temperature bake is equivalent within experimental error to the novel process. However, the ability to maintain this adhesion after being subjected to the hot solution environment is poor as compared with the coatings prepared by the novel process.

Table 4 is similar to Table 3 and is merely presented to show the clearly superior adhesion achieved when the tin hydrosol layer is in the order of a monolayer (0.8 $\mu g/cm^2$) as compared with thicker layers of hydrosol (17–20 $\mu g/cm^2$).

TABLE 4

EFFECT OF HYDROSOL DEPOSIT ON PEEL STRENGTH

| Treatment | Sn Weight ($\mu g\ cm^{-2}$) | Peel Strength(Pounds/Inch) | | |
|---|---|---|---|---|
| | | Dry | Wet | Recovery Bake (150° C./1 hr.) |
| Clean | 0 | 5.5 | 0.4 | 1.1 |
| Clean Hydrosol Bake, 250° C./15 min. | ~0.8 | 10.0 | 1.5 | 3.8 |
| | 17–20 | 0.2 | Delamination | — |
| Clean Hydrosol Silane Bake, 250° C./15 min. | ~0.8 | 14.0 | 10.3 | 10.7 |
| | 17–20 | 11.0 | 2.8 | 8.2 |

The FIG. is a graphical representation of the peel strength of epoxy coated steel foil as a function of immersion time in water at 72°±2° C. for substrates treated in accordance with the novel process (colloid/silane), substrates treated with silane but no colloid (silane, 130° C./25 min. bake), substrates coated after only an alkaline cleaning step (clean steel) and substrates which have been etched in $H_3PO_4$ to roughen the surface, cleaned and then coated ($H_3PO_4$ etch). It can readily be seen that while initial peel strengths, given in kilonewtons per meter, are equivalent for all but the cleaned only surface, with time, coatings prepared in accordance with the novel process retain their adhesion to a much greater extent than other coatings. It would therefore be expected that especially under high humidity, high temperature environments, the coatings of the novel process would be far superior in corrosion resistance and adhesion than the other coatings.

As previously indicated, the novel procedure can be used to prepare printed circuit boards by, for example, treating the coated metal with any of the known or available electroless plating solutions and processes to form a printed circuit thereon. Where through-holes are required, the substrate is preferably drilled prior to processing in accordance with this invention to provide these through-holes which can then be coated with the polymer during the coating process.

Similarly, the novel method can provide a metal tape, e.g., an aluminum, steel or tin coated steel tape having an adhesive coating thereon comprising the wetting hydrosol and coupling agent which can be stored and used at a later date for application of an adherent polymer thereto. More particularly, one can employ a coupling agent, e.g., an organo silane which couples to the wetting hydrosol, e.g., a hydrous tin oxide hydrosol wherein the coupling agent includes an $\alpha,\beta$ ethylenically unsaturated moiety capable of adhering well to polyethylene. Such a coated tape, e.g., steel coated tape, can then be employed as a cable shield for a polyethylene jacketed cable such as is taught in U.S. Pat. Nos. 3,681,515 and 3,829,340.

What is claimed is:

1. In combination, a substrate and a polymer adhesion enhancing layer thereon comprises the substrate, a wetting hydrosol having a cationic constituent on at least one surface of the substrate and adherent thereto and a coupling agent on the hydrosol and adherent thereto, the cationic constituent of the wetting hydrosol being dissimilar to any metallic constituent of the underlying substrate.

2. The combination recited in claim 1, wherein the substrate is a metal or a metal alloy.

3. The combination recited in claim 2, wherein the substrate is a metal selected from the group consisting of aluminum, steel or tinned steel.

4. The combination recited in claim 1, wherein the wetting hydrosol is a hydrosol of a hydrous metal oxide.

5. The combination recited in claim 1, wherein the wetting hydrosol is a tin hydrosol.

6. The combination recited in claim 1, wherein the coupling agent is selected from the group consisting of organo silanes, Werner complexes, organo-metallic compounds and polar surfactants.

7. The combination recited in claim 6, wherein the coupling agent is an organo-silane.

8. The combination recited in claim 1, including an adherent polymeric layer over the coupling agent.

9. The combination recited in claim 1, wherein the hydrosol is present in a thickness of about one monolayer.

10. The combination recited in claim 8, wherein the coupling agent contains moieties similar to the polymeric layer thereover.

11. A coated metal comprising a base metal, a monolayer of a hydrous oxide wetting hydrosol thereon having a cationic constituent different from the base metal, and a compatible coupling agent over the hydrosol.

12. The coated metal recited in claim 1, wherein the base metal is a flexible tape of steel, aluminum or tinned steel.

13. A printed circuit board comprises a base metal, a hydrous oxide wetting hydrosol on at least one surface of the base metal, the hydrosol having a cationic constituent which is different from the base metal, a coupling agent therefor and a compatible polymeric coating thereover.

14. The printed circuit board recited in claim 13, wherein the base metal is pre-drilled to provide through-holes and wherein the metal is coated on both sides and in the through-holes with the hydrosol, coupling agent and polymer.

15. The printed circuit board recited in claim 13, wherein the base metal is steel, the hydrosol is a hydrous tin oxide, the coupling agent is an amino-silane and the polymer coating is a rubber modified epoxy coating.

16. The printed circuit board recited in claims 14 or 15, including an electrolessly deposited metallic pattern on at least one surface thereof.

* * * * *